(12) United States Patent
Nikaido et al.

(10) Patent No.: US 8,395,906 B2
(45) Date of Patent: Mar. 12, 2013

(54) HIGH-SPEED TRANSMISSION CIRCUIT BOARD CONNECTION STRUCTURE

(75) Inventors: Masayuki Nikaido, Hitachi (JP);
Yoshiaki Ishigami, Hitachi (JP);
Kenichi Tamura, Hitachi (JP);
Takehiko Tokoro, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 282 days.

(21) Appl. No.: 12/801,279

(22) Filed: Jun. 1, 2010

(65) Prior Publication Data

US 2010/0328920 A1 Dec. 30, 2010

(30) Foreign Application Priority Data

Jun. 30, 2009 (JP) ................................. 2009-155954

(51) Int. Cl.
*H05K 1/11* (2006.01)
(52) U.S. Cl. ........ 361/803; 361/760; 361/792; 361/795; 361/794; 174/254
(58) Field of Classification Search .................. 361/803, 361/760, 792; 174/254
See application file for complete search history.

(56) References Cited

U.S. PATENT DOCUMENTS

| | | | | |
|---|---|---|---|---|
| 5,294,751 | A * | 3/1994 | Kamada ......................... | 174/541 |
| 5,402,318 | A * | 3/1995 | Otsuka et al. .................. | 361/794 |
| 2004/0050587 | A1 | 3/2004 | Tsukashima | |
| 2008/0153206 | A1* | 6/2008 | Stoneham et al. ............. | 438/109 |

FOREIGN PATENT DOCUMENTS

| | | |
|---|---|---|
| JP | 06-053702 A | 2/1994 |
| JP | 07-147351 A | 6/1995 |
| JP | 09-321501 A | 12/1997 |
| JP | 2002-185202 A | 6/2002 |
| JP | 2003-209401 A | 7/2003 |
| JP | 2004-112178 A | 4/2004 |
| JP | 2005-243970 A | 9/2005 |
| JP | 2006-229872 A | 8/2006 |

OTHER PUBLICATIONS

Japanese Office Action dated Sep. 4, 2012 with partial English translation thereof.

* cited by examiner

*Primary Examiner* — Tuan T Dinh
*Assistant Examiner* — Steven Sawyer
(74) *Attorney, Agent, or Firm* — McGinn IP Law Group, PLLC

(57) ABSTRACT

A high-speed transmission circuit board connection structure includes a first high-speed transmission circuit board including a laminated substrate including a first signal transmission wiring formed on a surface thereof and a ground plane formed inside thereof, a second high-speed transmission circuit board including a circuit substrate and a second signal transmission wiring formed on a surface of the circuit substrate, a conductive board connecting member for fixing the first and second high-speed transmission circuit boards to a surface thereof, and a bonding wire for electrically connecting the first signal transmission wiring and the second signal transmission wiring. The ground plane is exposed on a side end face of the laminated substrate, and a conductive film is formed on the side end face such that the ground plane of the first high-speed transmission circuit board is electrically connected to the board connecting member with the conductive film.

9 Claims, 3 Drawing Sheets

2 FIRST CIRCUIT BOARD
3 SECOND CIRCUIT BOARD
6 GROUND PLANE
14 BOARD CONNECTING MEMBER
17a BONDING WIRE
19 CONDUCTIVE FILM
20 CONDUCTIVE MEMBER

33 FIRST CIRCUIT BOARD
3 SECOND CIRCUIT BOARD
31 VCSEL ALLAY
32 IC
30 BOARD CONNECTING MEMBER
17a, 17b, 17c BONDING WIRE
37 GROUND PLANE
38 CONDUCTIVE FILM
20 CONDUCTIVE MEMBER 40, 46 CIRCUIT BOARD
43 GROUND PLANE
49 BOARD CONNECTING MEMBER
50 BONDING WIRE
51, 52 THROUGH-HOLE

HIGH-SPEED TRANSMISSION CIRCUIT BOARD CONNECTION STRUCTURE

The present application is based on Japanese patent application No. 2009-155954 filed on Jun. 30, 2009, the entire contents of which are incorporated herein by reference.

BACKGROUND OF THE INVENTION

1. Field of the Invention

The invention relates to a high-speed transmission circuit board connection structure for electrically connecting a high-speed transmission circuit board and another high-speed transmission circuit board.

2. Description of the Related Art

A high-speed transmission circuit board 40, such as shown in FIG. 4A, is used as a circuit board for transmitting a high-speed signal (high-frequency signal). The high-speed transmission circuit board 40 is composed of a laminated substrate 41 in which a first signal transmission wiring 42 and a ground wiring (not shown) are formed on a surface thereof and a ground plane 43 is formed inside (inner layer).

FIG. 4A shows a conventional structure for connecting the high-speed transmission circuit board 40 to another high-speed transmission circuit board. The other high-speed transmission circuit board in FIG. 4A is a portion where a second signal transmission wiring 46 is formed on a surface of a ceramic substrate 48. The high-speed transmission circuit board 40 and the ceramic substrate 48 are each fixed to a board connecting member 49. The board connecting member 49 is formed of a conductive member such as metal (e.g., kovar). The first signal transmission wiring 42 of the high-speed transmission circuit board 40 is electrically connected to the second signal transmission wiring 46 formed on a surface of the ceramic substrate 48 by a bonding wire 50. In addition, the ground plane 43 of the high-speed transmission circuit board 40 is electrically connected to the board connecting member 49 by a through hole 51 which penetrates the high-speed transmission circuit board 40.

Hereinafter, a wiring path composed of the ground plane 43 of the high-speed transmission circuit board 40 and the board connecting member 49 is referred to as a ground wiring, and a wiring path composed of the first signal transmission wiring 42 and the second signal transmission wiring 46 is referred to as a signal wiring.

However, when the ground plane 43 of the high-speed transmission circuit board 40 is connected to the board connecting member 49 by the through hole 51, the ground wiring increases in length. Furthermore, a distance between the signal wiring and the ground wiring is increased between the portion for electrically connecting the ground plane 43 to the board connecting member 49 via the through hole 51 and the bonding wire 50. Therefore, there is a problem that it is difficult to match impedance which depends on the distance between the signal wiring and the ground wiring.

In order to maintain the distance between the signal wiring and the ground wiring as constant as possible, the through hole 51 should be formed in the vicinity of the end portion of the high-speed transmission circuit board 40 which faces the ceramic substrate 48. However, as shown in FIG. 5, when the first signal transmission wirings 42 are densely formed in the vicinity of the end portion of the high-speed transmission circuit board 40, it is not possible to obtain the location for forming the through hole 51, hence, it is not possible to form the through hole 51 in the vicinity of the end portion of the high-speed transmission circuit board 40.

On the other hand, as shown in FIG. 4B, a high-speed transmission circuit board 53 as a build-up substrate in which a through hole 52 for conducting from a lower surface of the laminated substrate 41 to the ground plane 43 is formed inside the laminated substrate 41 may be used in order to bring the formation position of the through hole close to the vicinity of the end portion of the high-speed transmission circuit board 40. However, there is a problem that the cost of the build-up substrate is higher than the laminated substrate having a through hole formed so as to penetrate front and back surfaces.

SUMMARY OF THE INVENTION

Therefore, it is an object of the invention to provide a high-speed transmission circuit board connection structure which is easy to match impedance and is low cost.

(1) According to one embodiment of the invention, a high-speed transmission circuit board connection structure comprises:

a first high-speed transmission circuit board comprising a laminated substrate comprising a first signal transmission wiring formed on a surface thereof and a ground plane formed inside thereof;

a second high-speed transmission circuit board comprising a circuit substrate and a second signal transmission wiring formed on a surface of the circuit substrate;

a conductive board connecting member for fixing the first and second high-speed transmission circuit boards to a surface thereof; and a bonding wire for electrically connecting the first signal transmission wiring of the first high-speed transmission circuit board and the second signal transmission wiring of the second high-speed transmission circuit board, wherein the ground plane of the laminated structure is exposed on a side end face of the laminated substrate, and a conductive film is formed on the side end face of the laminated substrate such that the ground plane of the first high-speed transmission circuit board is electrically connected to the board connecting member with the conductive film.

In the above embodiment (1), the following modifications and changes can be made.

(i) An end portion of the first signal transmission wiring is formed a predetermined distance away from an end portion of the laminated substrate, and the conductive film is formed so as to cover a portion of a region of the surface of the laminated substrate between the end portion of the first signal transmission wiring and the end portion of the laminated substrate.

(ii) The first high-speed transmission circuit board is opposite and forms a predetermined gap with the second high-speed transmission circuit board, and a conductive member is filled in the gap.

(iii) The conductive member is filled to a level higher than a surface of the board connecting member to which the second high-speed transmission circuit board is fixed.

(iv) A ground wiring is formed on both sides of the first signal transmission wiring on the surface of the laminated structure, and an end portion of the ground wiring is electrically connected to the conductive film.

(v) The board connecting member comprises a stepped portion, and thus comprises a thin portion and a thick portion that are bordered by the stepped portion, the first high-speed transmission circuit board is fixed to a surface of the thin portion and the second high-speed transmission circuit board is fixed to a surface of the thick portion, and the stepped portion has a height such that a surface height of the first high-speed transmission circuit board coincides with that of the second high-speed transmission circuit board.

POINTS OF THE INVENTION

In accordance with one embodiment of the invention, a high-speed transmission circuit board connection structure is constructed such that the connecting end of a first signal transmission wiring is formed a predetermined distance away from the end portion of a laminated substrate, and a conductive film is formed so as to cover a portion of a region of the surface of the laminated substrate between the end portion of the first signal transmission wiring and the end portion of the laminated substrate. Thereby, it is possible to decrease the distance (or clearance) between a ground wiring formed by the conductive film and a signal wiring formed by a bonding wire to facilitate the impedance matching.

BRIEF DESCRIPTION OF THE DRAWINGS

Next, the present invention will be explained in more detail in conjunction with appended drawings, wherein:

FIGS. 2A and 2B are views showing a first high-speed transmission circuit board used for the high-speed transmission circuit board connection structure in the embodiment of the invention, wherein FIG. 2A is a top view and FIG. 2B is a side view;

FIGS. 3A and 3B are views showing an application example of the invention, wherein FIG. 3A is a top view and FIG. 3B is a side view;

DETAILED DESCRIPTION OF THE PREFERRED EMBODIMENTS

A preferred embodiment of the invention will be described below in conjunction with the appended drawings.

Figure 1:
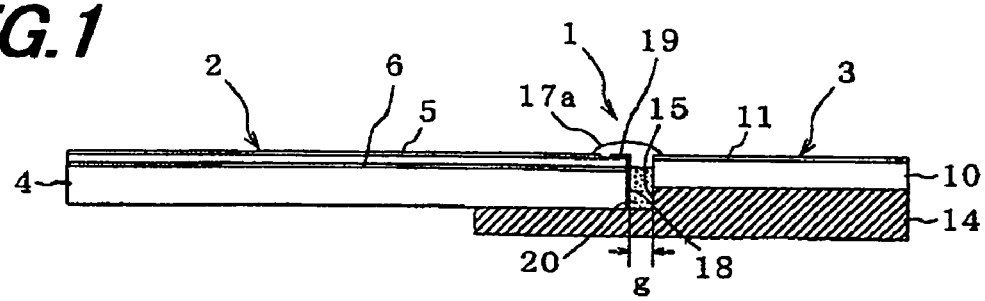
FIG. 1 is a side view showing a high-speed transmission circuit board connection structure in an embodiment of the present invention.

FIG. 1 is a side view showing a high-speed transmission circuit board connection structure in an embodiment of the invention.

As shown in FIG. 1, a high-speed transmission circuit board connection structure 1 is a structure in which a high-speed transmission circuit board (i.e., first high-speed transmission circuit board) 2 is electrically connected to another high-speed transmission circuit board (i.e., second high-speed transmission circuit board) 3 by using a board connecting member 14.

Firstly, the first high-speed transmission circuit board 2, the second high-speed transmission circuit board 3 and the board connecting member 14, which compose the high-speed transmission circuit board connection structure 1, will be explained.

Figure 2A:
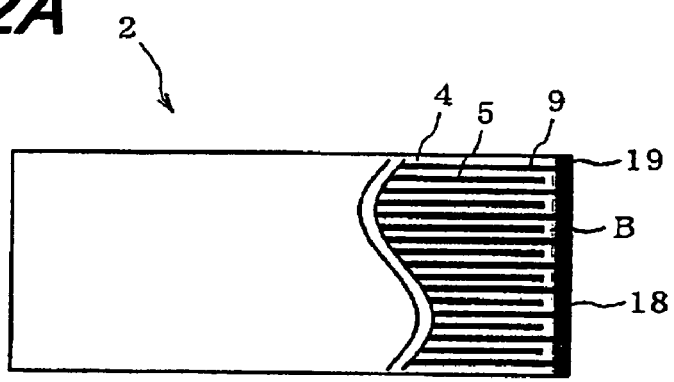
Figure 2B:
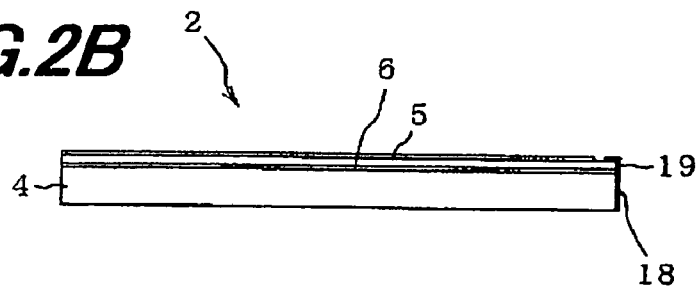

As shown in FIGS. 2A and 2B, the first high-speed transmission circuit board 2 is composed of a laminated substrate 4 in which a first signal transmission wiring 5 is formed on the surface thereof and a ground plane 6 is formed inside. Ground wirings 9 are formed on both sides of the first signal transmission wiring 5 on the surface of the laminated substrate 4.

A signal at a bit rate of about, e.g., 10 Gb/s-12.5 Gb/s is transmitted in the first high-speed transmission circuit board 2. Line widths of the first signal transmission wiring 5 and the ground wiring 9 as well as an arrangement interval therebetween are, e.g., 100 µm. A signal at frequency of about 5 GHz-6.25 GHz is transmitted per first signal transmission wiring 5.

In the present embodiment, the ground plane 6 is formed so as to be exposed on a side edge surface 18 of the first high-speed transmission circuit board 2, and a conductive film 19 is formed on the side edge surface 18 so as to be electrically connected to the exposed ground plane 6 as well as to be connected to a lower portion of the side edge surface 18 (a back side of the first high-speed transmission circuit board 2).

An end portion of the first signal transmission wiring 5 formed on the surface of the first high-speed transmission circuit board 2 is formed at a predetermined distance from an end portion of the laminated substrate 4. The conductive film 19 is formed so as to cover a portion of a region of the surface of the laminated substrate 4 between the end portion of the first signal transmission wiring 5 and the end portion of the laminated substrate 4. The first signal transmission wiring 5 is insulated from the conductive film 19 via a blank area B. The ground wiring 9 is connected to, at the end portion thereof, the conductive film 19.

The second high-speed transmission circuit board 3 is composed of an insulating circuit substrate 10 and a second signal transmission wiring 11 formed on the surface of the circuit substrate 10. The circuit substrate 10 is formed of, e.g., a ceramic substrate. The circuit substrate 10 is formed thinner in thickness than the laminated substrate 4.

The board connecting member 14 is for fixing the first high-speed transmission circuit board 2 and the second high-speed transmission circuit board 3 to the surface thereof. The board connecting member 14 is formed of a conductive substrate such as, e.g., a Cu—W (copper-tungsten) plate or a kovar plate. The board connecting member 14 has a stepped portion 15, and thus has a relatively thick portion and a relatively thin portion that are bordered by the stepped portion 15.

A back surface of the second high-speed transmission circuit board 3 and a front surface of the thick portion of the board connecting member 14 are bonded by adhesive, and the second high-speed transmission circuit board 3 is thus fixed to the board connecting member 14. The second high-speed transmission circuit board 3 is arranged such that a position of the end surface thereof on the side opposite to the first high-speed transmission circuit board 2 substantially coincides with the stepped portion 15.

A back surface of the first high-speed transmission circuit board 2 and a front surface of the thin portion of the board connecting member 14 are bonded by adhesive, and the first high-speed transmission circuit board 2 is thus fixed to the board connecting member 14. The first high-speed transmission circuit board 2 is arranged such that a predetermined gap g is formed between a position of the end surface thereof on the side opposite to the second high-speed transmission circuit board 3 and the end surface of the second high-speed transmission circuit board 3.

The stepped portion 15 is formed to have a height such that the surface height of the first high-speed transmission circuit board 2 coincides with that of the second high-speed transmission circuit board 3.

The first signal transmission wiring 5 of the first high-speed transmission circuit board 2 is electrically connected to the second signal transmission wiring 11 of the second high-speed transmission circuit board 3 by a bonding wire 17*a*. The ground plane 6 of the first high-speed transmission circuit board 2 is electrically connected to the board connecting member 14 by the conductive film 19 which is formed on a side edge surface of the first high-speed transmission circuit board 2. The board connecting member 14 functions as a ground plane opposite to the second signal transmission wiring 11 of the second high-speed transmission circuit board 3.

Hereinafter, a wiring path composed of the ground plane 6 of the first high-speed transmission circuit board 2 and the board connecting member 14 is referred to as a ground wiring, and a wiring path composed of the first signal transmission wiring 5 and the second signal transmission wiring 11 is referred to as a signal wiring.

The high-speed transmission circuit board connection structure 1 of the present embodiment is a structure in which, when the first high-speed transmission circuit board 2 is fixed to the board connecting member 14, the ground plane 6 of the first high-speed transmission circuit board 2 is electrically connected to the board connecting member 14 by a contact of the conductive film 19 formed on the edge surface of the first high-speed transmission circuit board 2 with the board connecting member 14.

A conductive member 20 such as conductive adhesive is filled in the predetermined gap g between the first high-speed transmission circuit board 2 and the second high-speed transmission circuit board 3. The height of the conductive member 20 filled in the gap g is adjusted so as to be a position in which impedance determined by a distance between the bonding wire 17*a* and the conductive member 20 can be matched to impedance in the first high-speed transmission circuit board 2 and the second high-speed transmission circuit board 3. For example, as shown in FIG. 1, the bonding wire 17*a* is located above the second signal transmission wiring 11 of the second high-speed transmission circuit board 3. Therefore, the conductive member 20 is preferably filled to reach a higher level than the surface of the thick portion of the board connecting member 14 to be a ground plane of the second signal transmission wiring 11 of the second high-speed transmission circuit board 3 such that the distance between the bonding wire 17*a* and the conductive member 20 comes close to the distance between the second signal transmission wiring 11 and the surface of the thick portion of the board connecting member 14. Likewise, as shown in FIG. 1, the bonding wire 17*a* is located above first signal transmission wiring 5 of the first high-speed transmission circuit board 2. Therefore, the conductive member 20 is preferably filled to reach a higher level than the ground plane 6 of the first high-speed transmission circuit board 2 such that the distance between the bonding wire 17*a* and the conductive member 20 comes close to the distance between the first signal transmission wiring 5 and the ground plane 6 of the first high-speed transmission circuit board 2. Alternatively, the conductive member 20 may be filled in the gap g so as to be lower than the surfaces of the first high-speed transmission circuit board 2 and the second high-speed transmission circuit board 3 such that the conductive member 20 does not contact with the first signal transmission wiring 5 of the first high-speed transmission circuit board 2 or the second signal transmission wiring 11 of the second high-speed transmission circuit board 3.

The conductive member 20 can be filled in the gap g by adhering between the first high-speed transmission circuit board 2 and the board connecting member 14 using conductive adhesive so that a portion of the conductive adhesive leaks into the gap g at the time. Alternatively, the conductive member 20 may be externally injected into the gap g.

It is possible to bring the end portion of the first high-speed transmission circuit board 2 into contact with the side portion of the stepped portion 15 without providing the gap g, however, it is necessary to process the end portion of the first high-speed transmission circuit board 2 and the side portion of the stepped portion 15 at very high accuracy in order to completely eliminate the gap g, and thus, it is preferable to compensate a production error by filling with the conductive member 20 from the viewpoint of the cost.

According to the high-speed transmission circuit board connection structure 1 of the present embodiment, it is possible to electrically connect the ground plane 6 of the first high-speed transmission circuit board 2 to the board connecting member 14 without forming a through hole. Furthermore, since it is possible to shorten the length of the ground wiring and to decrease the distance between the signal wiring and the ground wiring, it is easy to match impedance which depends on the distance between the signal wiring and the ground wiring.

In addition, in the high-speed transmission circuit board connection structure 1 of the present embodiment, since the connecting end of the first signal transmission wiring 5 is formed at a predetermined distance from the end portion of the laminated substrate 4 and the conductive film 19 is formed so as to cover a portion of the region of the surface of the laminated substrate 4 between the end portion of the first signal transmission wiring 5 and the end portion of the laminated substrate 4, it is possible to decrease the distance between the ground wiring composed of the conductive film 19 and the signal wiring composed of the bonding wire 17*a*, thus, the impedance matching is facilitated.

In addition, in the high-speed transmission circuit board connection structure 1 of the present embodiment, since the predetermined gap g is provided between the first high-speed transmission circuit board 2 and the second high-speed transmission circuit board 3 and the conductive member 20 such as conductive adhesive is filled in the gap g so as to be higher than the ground plane 6 of the first high-speed transmission circuit board 2, the ground wiring is further shortened and the distance between the signal wiring composed of the bonding wire 17*a* and the ground wiring composed of the conductive member 20 can be decreased between the first high-speed transmission circuit board 2 and the second high-speed transmission circuit board 3, thus, the impedance matching is facilitated.

An application example of the high-speed transmission circuit board connection structure in the present embodiment will be explained below.

Figure 3A:
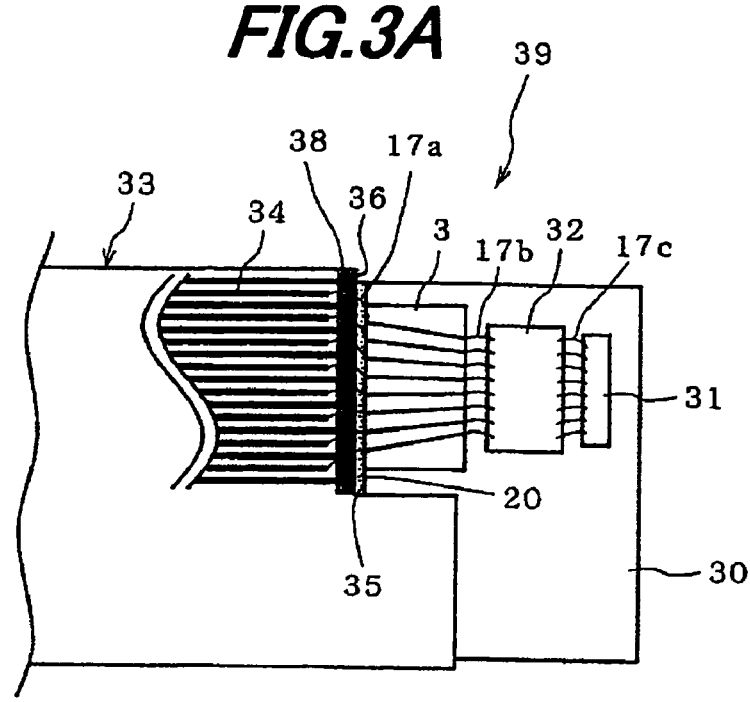
Figure 3B:
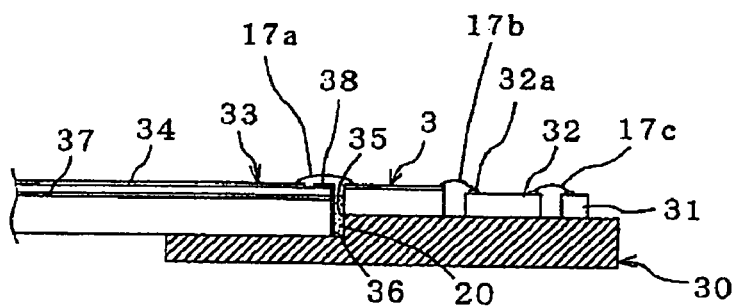
Figure 4A:
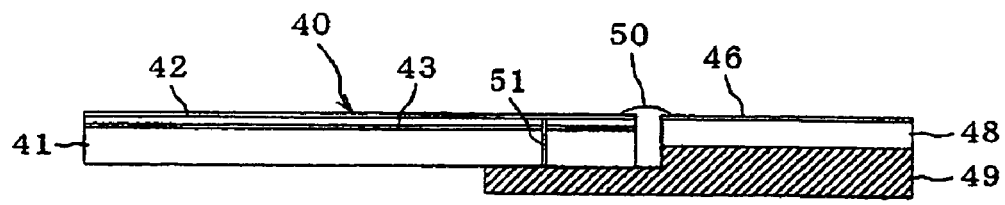
FIGS. 4A and 4B are side views showing a conventional high-speed transmission circuit board connection structure.
Figure 4B:
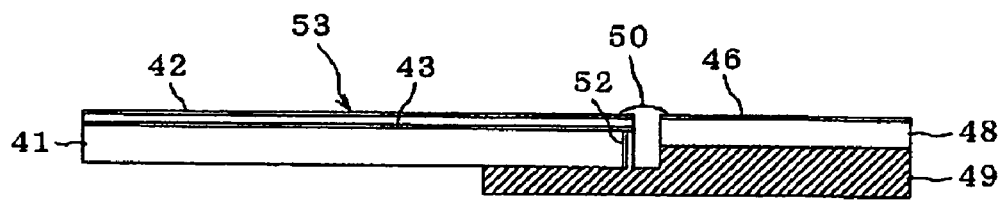
Figure 5:
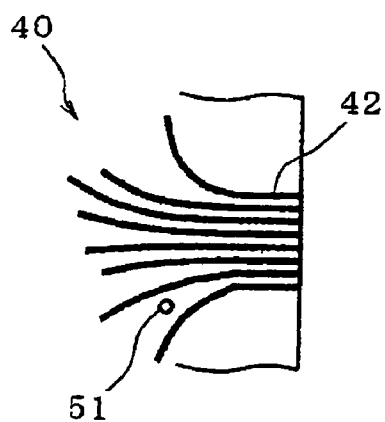
FIG. 5 is a view for explaining a problem for forming a through hole in the high-speed transmission circuit board.

The application example shown in FIG. 3 is an optical communication module 39 which is composed of a first high-speed transmission circuit board 33 having a first signal transmission wiring 34 formed on a surface thereof, the second high-speed transmission circuit board 3, a VCSEL array 31, an IC 32 for driving the VCSEL array 31, and a board connecting member 30 which mounts the second high-speed transmission circuit board 3, the IC 32 and the VCSEL array 31 on the surface thereof and is adhesively fixed to the back surface of the first high-speed transmission circuit board 33 at a portion of the surface thereof.

The second high-speed transmission circuit board 3 is formed of a ceramic substrate, and a second signal transmission wiring for converting a pitch interval to match an arrangement interval of an electrode 32*a* of the IC 32 to that of the first signal transmission wiring 34 is formed on the surface of the second high-speed transmission circuit board 3.

The board connecting member 30 is formed of a conductive substrate such as a Cu—W plate or a kovar plate. The board connecting member 30 has a stepped portion 35, and the second high-speed transmission circuit board 3, the IC 32 and the VCSEL array 31 are mounted on the surface of the thick portion bordered by the stepped portion 35. The back surface of the first high-speed transmission circuit board 33 is adhesively fixed to the surface of the thin portion.

The bonding wire 17a electrically connects between the first signal transmission wiring 34 of the first high-speed transmission circuit board 33 and the second signal transmission wiring of the second high-speed transmission circuit board 3. A bonding wire 17b electrically connects between the second signal transmission wiring of the second high-speed transmission circuit board 3 and the electrode 32a of the IC 32. A bonding wire 17c electrically connects between the VCSEL array 31 and the IC 32.

By the optical communication module 39, it is possible to convert the pitch interval of the signal transmission wirings by electrically connecting the first signal transmission wiring 34 of the first high-speed transmission circuit board 33 to the electrode 32a of the IC 32 via the second high-speed transmission circuit board 3.

The high-speed transmission circuit board connection structure of the present embodiment is applied to the electrical connection between the first high-speed transmission circuit board 33 and the second high-speed transmission circuit board 3.

A ground plane 37 is formed so as to be exposed on a side edge surface 36 of the first high-speed transmission circuit board 33, a conductive film 38 is formed on the side edge surface 36 so as to be electrically connected to the ground plane 37 exposed on the side edge surface 36 as well as to cover to the lower portion of the side edge surface 36 and the conductive film 38 is contacted with the board connecting member 30, thereby electrically connecting the ground plane 37 to the board connecting member 30.

According to the optical communication module 39 configured as described above, it is easy to match the impedance at a connecting portion of the first high-speed transmission circuit board 33 with the second high-speed transmission circuit board 3, and the signal quality can be stably maintained.

Although the invention has been described with respect to the specific embodiment for complete and clear disclosure, the appended claims are not to be therefore limited but are to be construed as embodying all modifications and alternative constructions that may occur to one skilled in the art which fairly fall within the basic teaching herein set forth.

What is claimed is:

1. A high-speed transmission circuit board connection structure, comprising:
   a first high-speed transmission circuit board comprising a laminated substrate comprising a first signal transmission wiring formed on a surface thereof and a ground plane formed inside thereof;
   a second high-speed transmission circuit board comprising a circuit substrate and a second signal transmission wiring formed on a surface of the circuit substrate;
   a conductive board connecting member for fixing the first and second high-speed transmission circuit boards to a surface thereof; and
   a bonding wire for electrically connecting the first signal transmission wiring of the first high-speed transmission circuit board and the second signal transmission wiring of the second high-speed transmission circuit board,
   wherein the ground plane of the laminated structure is exposed on a side end face of the laminated substrate,
   wherein a conductive film is formed on the side end face of the laminated substrate such that the ground plane of the first high-speed transmission circuit board is electrically connected to the board connecting member with the conductive film,
   wherein the first high-speed transmission circuit board is located opposite to the second high-speed transmission circuit board such that a predetermined gap is formed between the first high-speed transmission circuit board and the second high-speed transmission circuit board, and a conductive member is filled in the gap, and
   wherein the conductive member is filled to reach a higher level than the ground plane of the first high-speed transmission circuit board.

2. The high-speed transmission circuit board connection structure according to claim 1, wherein an end portion of the first signal transmission wiring is located at a predetermined distance away from an end portion of the laminated substrate, and
   wherein the conductive film is formed so as to cover a portion of a region of the surface of the laminated substrate between the end portion of the first signal transmission wiring and the end portion of the laminated substrate.

3. The high-speed transmission circuit board connection structure according to claim 1, wherein the conductive member is filled in the gap to a level higher than a surface of the board connecting member to which the second high-speed transmission circuit board is fixed.

4. The high-speed transmission circuit board connection structure according to claim 1, wherein a ground wiring is formed on both sides of the first signal transmission wiring on the surface of the laminated structure, and
   wherein an end portion of the ground wiring is electrically connected to the conductive film.

5. The high-speed transmission circuit board connection structure according to claim 1, wherein the board connecting member comprises a stepped portion, and a thin portion and a thick portion that are bordered by the stepped portion,
   wherein the first high-speed transmission circuit board is fixed to a surface of the thin portion and the second high-speed transmission circuit board is fixed to a surface of the thick portion, and
   wherein the stepped portion has a height such that a surface height of the first high-speed transmission circuit board coincides with that of the second high-speed transmission circuit board.

6. The high-speed transmission circuit board connection structure according to claim 1, wherein, with respect to a bottom surface of the conductive board connecting member, an upper surface the conductive member is located higher than an upper surface of the ground plane of the first high-speed transmission circuit board.

7. The high-speed transmission circuit board connection structure according to claim 1, wherein the conductive member is disposed on a side surface of the circuit substrate.

8. The high-speed transmission circuit board connection structure according to claim 1, wherein, with respect to a bottom surface of the conductive board connecting member, the surface of the circuit substrate is located higher than an upper surface the conductive member.

9. The high-speed transmission circuit board connection structure according to claim 6, wherein, with respect to the bottom surface of the conductive board connecting member, the surface of the circuit substrate is located higher than the upper surface the conductive member.

* * * * *